United States Patent
Song et al.

(10) Patent No.: US 7,952,388 B1
(45) Date of Patent: May 31, 2011

(54) SEMICONDUCTOR DEVICE

(75) Inventors: Taek-Sang Song, Gyeonggi-do (KR);
Dae-Han Kwon, Gyeonggi-do (KR);
Jun-Woo Lee, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 12/648,477

(22) Filed: Dec. 29, 2009

(30) Foreign Application Priority Data

Nov. 24, 2009 (KR) .......................... 10-2009-0113889

(51) Int. Cl.
*H03K 19/094* (2006.01)
*H03K 19/0175* (2006.01)
(52) U.S. Cl. .............................. 326/68; 326/80; 326/115
(58) Field of Classification Search .................. None
See application file for complete search history.

(56) References Cited

U.S. PATENT DOCUMENTS 6,819,137 B1 * 11/2004 Wang et al. ..................... 326/68
7,646,220 B2 * 1/2010 Wu ................................. 326/82

FOREIGN PATENT DOCUMENTS

KR 100912968 8/2009
KR 1020090114990 11/2009

OTHER PUBLICATIONS

Notice of Allowance issued from Korean Intellectual Property Office on Jan. 25, 2011.

* cited by examiner

*Primary Examiner* — Anh Q Tran
(74) *Attorney, Agent, or Firm* — IP & T Group LLP (57) ABSTRACT

A semiconductor device includes a swing level shifting unit configured to use a first power supply voltage as a power supply voltage, receive a CML clock swinging around a first voltage level, and shift a swing reference voltage level of the CML clock to a second voltage level lower than the first voltage level, and a CML clock transfer buffering unit configured to use a second power supply voltage as a power supply voltage and buffer the CML clock, which is transferred from the swing level shifting unit and swings around the second voltage level.

17 Claims, 8 Drawing Sheets

SEMICONDUCTOR DEVICE

CROSS-REFERENCE TO RELATED APPLICATIONS

The present application claims priority of Korean Patent Application No. 10-2009-0113889, filed on Nov. 24, 2009, which is incorporated herein by reference in its entirety.

BACKGROUND OF THE INVENTION

Exemplary embodiments of the present invention relate to a semiconductor design technology, and more particularly, to a circuit for generating or transferring a signal swinging in a current mode logic (CML) region.

In semiconductor devices, a signal swinging in a CML region (hereinafter, referred to as a CML signal) is widely used in an input/output (I/O) interface for a high frequency signal, such as a clock signal.

The CML region refers to a potential level region having a predefined range defined by a predefined DC potential level, or a potential level region having a predefined range defined by an average potential level determined by a predefined criterion. The CMS signal refers to a signal toggling at a predefined frequency between a maximum potential level (Vmax) of the CML region and a minimum potential level (Vmin) of the CML region with the center of a reference potential level in the CML region.

For example, although a level of a power supply voltage (VDD) and a level of a ground voltage (VSS) in a device for inputting/outputting a CML signal are 1.5 V and 0 V, respectively, the CML region may be defined in a range from 1.5 V to 1.0 V. A reference potential level of the CML region is 1.25 V, and the CML signal is a signal toggling at a predefined frequency in a swing range of 0.5 V with a center of 1.25 V.

As described above, the CML region is designed to have a relatively small size compared with a potential level region defined by a difference between a level of a power supply voltage (VDD) and a level of a ground voltage (VSS) in a device for inputting/outputting a CML signal. This is because the CML signal is generally a high frequency clock signal.

That is, the CML region is a region defined for transferring a clock signal stably even though the clock signal is a high frequency clock signal ranging from several GHz to several tens of GHz or more.

In semiconductor devices, a signal swinging in a CMOS region (hereinafter, referred to as a CMOS signal) is widely used in an I/O interface for a signal which determines a logic level.

The CMOS region refers to a potential level region defined by a difference between a level of a power supply voltage (VDD) and a level of a ground voltage (VSS). The CMOS signal refers to a signal toggling at a predefined frequency between a level of a power supply voltage (VDD), which is a maximum potential level (Vmax) of the CMOS region, and a level of a ground voltage (VSS), which is a minimum potential level (Vmin) of the CMOS region, with the center of half the potential level between the level of the power supply voltage (VDD) and the level of the ground voltage (VSS).

Therefore, as described above, in the case of the CML region, even though the level of the power supply voltage (VDD) and the level of the ground voltage (VSS) are 1.5 V and 0 V, respectively, the potential levels of 1.5 V and 0 V are specified as the CML region, so that the swing range of the CML signal may be 0.5 V. However, in the case of the CMOS region, when the level of the power supply voltage (VDD) and the level of the ground voltage (VSS) are 1.5 V and 0 V, respectively, the potential levels of 1.5 V and 0 V are determined as the CMOS region. Thus, the swing range of the CMOS signal is 1.5 V.

For this reason, the swing range of the CMOS signal is inevitably lager than the swing range of the CML signal. This means that the CMOS signal is suitable for use as data whose logic level is determined according to the potential level.

Figure 1A:
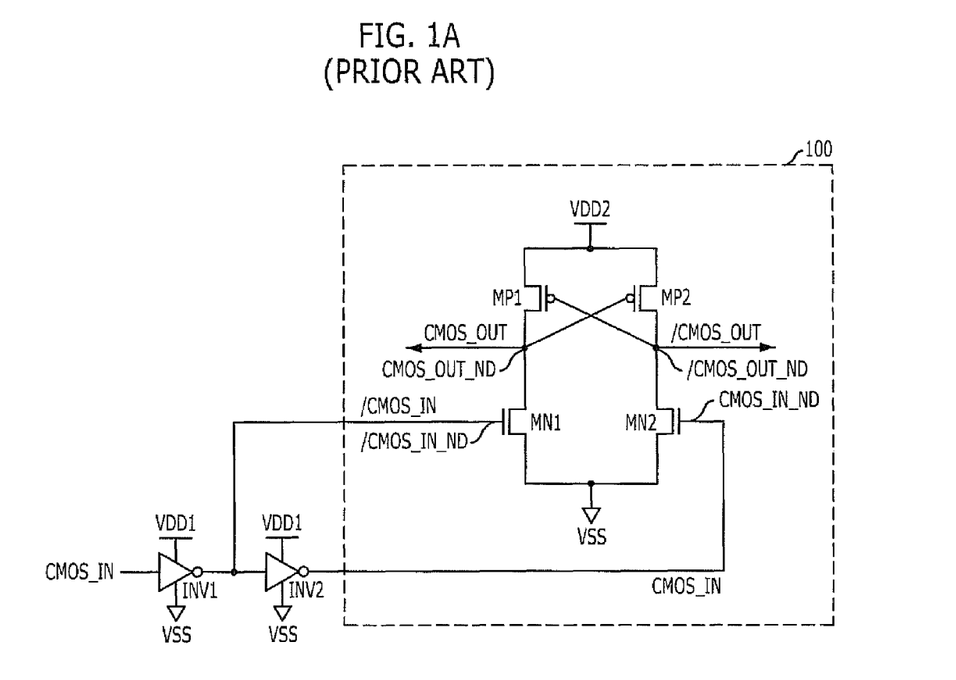
FIG. 1A is a circuit diagram of a circuit for shifting a voltage level of a CMOS signal in a conventional semiconductor device.

FIG. 1A is a circuit diagram of a circuit for shifting a voltage level of a CMOS signal in a conventional semiconductor device.

Figure 1B:
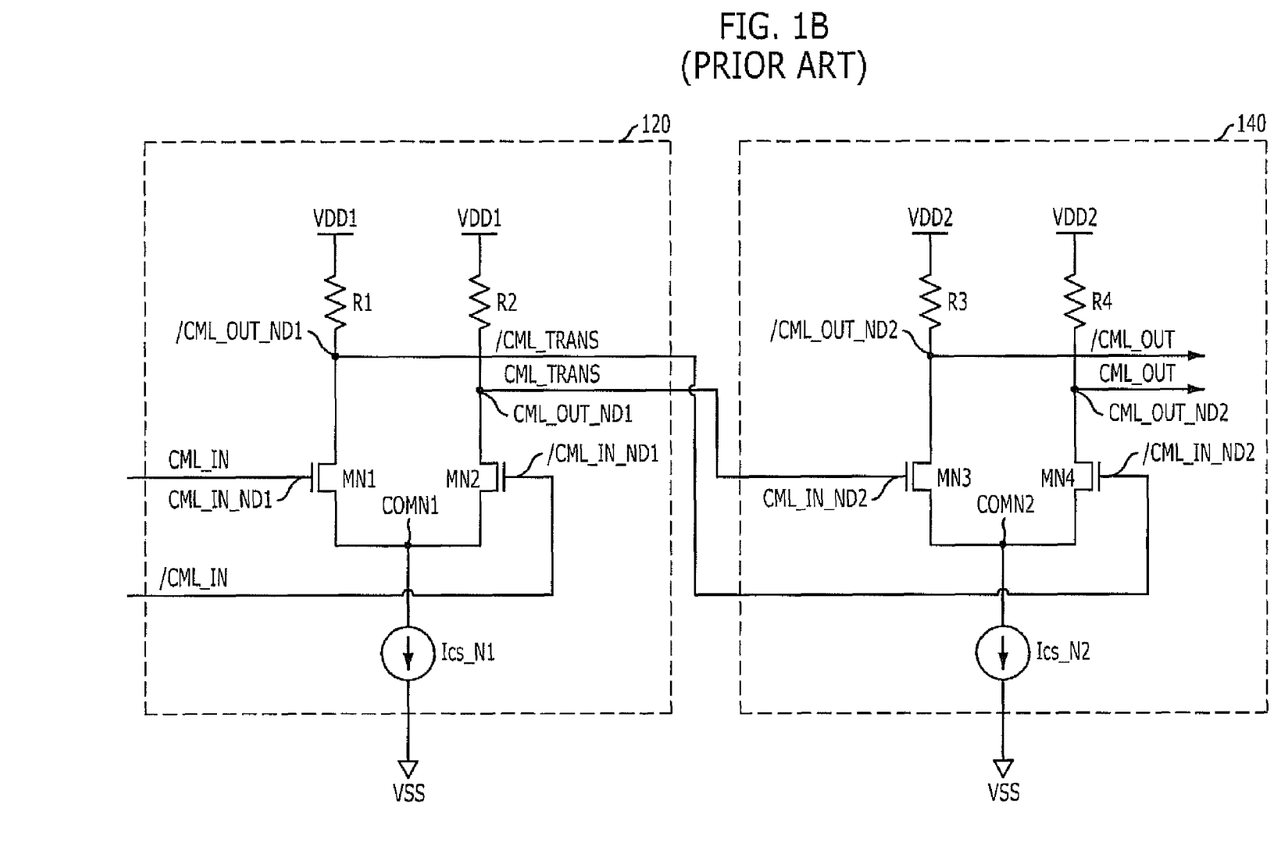
FIG. 1B is a circuit diagram of a circuit for shifting a voltage level of a CML signal in a conventional semiconductor device.

FIG. 1B is a circuit diagram of a circuit for shifting a voltage level of a CML signal in a conventional semiconductor device.

Referring to FIG. 1A, a CMOS signal CMOS_IN is inputted to inverters INV1 and INV2, which use a first power supply voltage VDD1 as a power supply voltage, and outputted as CMOS signals CMOS_IN and /CMOS_IN swinging between the first power supply voltage VDD1 and the ground voltage VSS.

The CMOS signals CMOS_IN and /CMOS_IN swinging between the first power supply voltage VDD1 and the ground voltage VSS are inputted to a voltage level shifter 100, which uses a second power supply voltage VDD2 as a power supply voltage, and outputted as CMOS signals CMOS_OUT and /CMOS_OUT swinging between the second power supply voltage VDD2 and the ground voltage VSS.

The operation of the voltage level shifter 100 will be described below in more detail. The voltage level shifter 100 performs an operation of making the voltage levels at CMOS signal output terminals CMOS_OUT_ND and /CMOS_OUT_ND swing in the CMOS region between the second power supply voltage VDD2 and the ground voltage VSS by controlling the CMOS signal output terminals CMOS_OUT_ND and /CMOS_OUT_ND in response to the CMOS signals CMOS_IN and /CMOS_IN. The CMOS signal output terminals CMOS_OUT_ND and /CMOS_OUT_ND are connected to drains of the NMOS transistors MN1 and MN2, respectively, and the ground voltage (VSS) terminal is connected to sources of the NMOS transistors MN1 and MN2. The CMOS signals CMOS_IN and /CMOS_IN swing between the first power supply voltage VDD1 and the ground voltage VSS, and are inputted to gates of the NMOS transistors MN1 and MN2.

In this case, the swing range is sufficiently wide. This can be seen from the fact that the CMOS signals CMOS_IN and /CMOS_IN, swinging between the first power supply voltage VDD1 and the ground voltage VSS and being inputted to the gates of the NMOS transistors MN1 and MN2, swing in the CMOS region. Thus, the NMOS transistors MN1 and MN2 provided in the voltage level shifter 100 may operate normally, without any problems.

Therefore, the voltage level shifter 100 having the configuration of FIG. 1A may perform the power supply voltage level shifting operation normally, whether the level of the first power supply voltage VDD1 is higher or lower than the level of the second power supply voltage VDD2.

Referring to FIG. 1B, a CML buffer 120, which uses the first supply voltage VDD1 as a power supply voltage, receives CML signals CML_IN and /CML_IN to generate CML signals CML_TRANS and /CML_TRANS swinging with the center at a first voltage level lower than the first power supply voltage VDD1 by a set voltage level.

Since the CML signal has a narrow swing range as described above, the first voltage level lower than the first power supply voltage VDD1 by the set voltage level is expected to be higher than a voltage level of ½*VDD1. Therefore, the swing centers of the CML signals CML_

TRANS and /CML_TRANS, outputted from the CML buffer 120 using the first power supply voltage VDD1 as the power supply voltage, are expected to lean toward the voltage level of the first power supply voltage VDD1.

The operation of the CML buffer 120 using the first power supply voltage VDD1 as the power supply voltage will be described below in more detail. When the CML input signals CML_IN and /CML_IN inputted to the CML buffer 120 have a swing range enough to turn on/off the NMOS transistors MN1 and MN2 provided in the CML buffer 120, it is possible to generate the CML signals CML_TRANS and /CML_TRANS swinging around the first voltage level lower than the voltage level of the first power supply voltage VDD1 by the set voltage level, while alternately turning on/off the NMOS transistors MN1 and MN2 provided in the CML buffer 120.

The CML signals CML_TRANS and /CML_TRANS swinging around the first voltage level lower than the voltage level of the first power supply voltage VDD1 by the set voltage level are inputted to the CML buffer 140, which uses the second power supply voltage VDD2 as the power supply voltage. The CML buffer outputs the CML signals CML_OUT and /CML_OUT, which swing around the second voltage level lower than the voltage level of the second power supply voltage VDD2 by the set voltage level, and are generated through the same operation as the CML buffer 120. In this way, the power supply voltage level shifting operation is completed.

In the power supply voltage level shifting circuit having the configuration of FIG. 1B, however, the power supply voltage level shifting operation may not be normally performed according to the relationship between the level of the first power supply voltage VDD1 and the level of the second power supply voltage VDD2.

That is, when the level of the first power supply voltage VDD1 is lower than the level of the second power supply voltage VDD2, the CML signals CML_TRANS and /CML_TRANS outputted from the CML buffer 120 using the first power supply voltage VDD1 can have a swing range large enough to turn on/off the NMOS transistors MN3 and MN4 provided in the CML buffer 140 using the second power supply voltage VDD2. Thus, the power supply voltage level shifting operation may be performed without any problems.

However, when the level of the first power supply voltage VDD1 is higher than the level of the second power supply voltage VDD2, the CML signals CML_TRANS and /CML_TRANS outputted from the CML buffer 120 using the first power supply voltage VDD1 may not have a swing range large enough to turn on/off the NMOS transistors MN3 and MN4 provided in the CML buffer 140 using the second power supply voltage VDD2. Thus, the power supply voltage level shifting operation may not be performed.

For example, it is assumed that the level of the first power supply voltage VDD1 is 2.1 V, the level of the second power supply voltage VDD2 is 1.2 V, the swing range of the CML signals CML_TRANS and /CML_TRANS outputted from the CML buffer 120 using the first power supply voltage VDD1 is 0.4 V (range of 2.1 V to 1.7 V), and the threshold voltages (Vth) provided in the NMOS transistors MN3 and MN4 of the CML buffer 140 using the second power supply voltage VDD2 are 0.4 V. In this case, in order to make a current flow between the drains and the sources of the NMOS transistors MN3 and MN4 provided in the CML buffer 140 using the second power supply voltage VDD2, the voltage levels of the source terminals must be lower than the voltage levels of the drain terminals. The voltage levels of the drain terminals must be 1.2 V and the voltage levels of the source terminals must be 0.8 V. However, since the swing range of the CML signals CML_TRANS and /CML_TRANS outputted from the CML buffer 120 using the first power supply voltage VDD1 and inputted to the gates of the NMOS transistors MN3 and MN4 are in a range from 2.1 V to 1.7 V, a current always flows between the drains and the sources of the NMOS transistors MN3 and MN4 provided in the CML buffer 140 using the second power supply voltage VDD2, without regard to the variation in the levels of the CML signals CML_TRANS and /CML_TRANS. Hence, the CML output signals CML_OUT and /CML_OUT do not swing, but always maintain the level of 0.8 V.

The power supply voltage level shifting circuit having the configuration of FIG. 1B has not been practically used because the power supply voltage level shifting operation may not be normally performed according to the relationship between the level of the first power supply voltage VDD1 and the level of the second power supply voltage VDD2. Therefore, the level shifter having the configuration of FIG. 1A is embedded into the level shifter having the configuration of FIG. 1B in order to perform the power supply voltage level shifting operation successfully.

That is, in order to shift the levels of the CML signals, the CML signals are converted into the CMOS signals, level-shifted in the CMOS region, and then again converted into the CML signals.

However, if the swing region is converted several times, jitters may occur in the signals during the conversion operations, or a duty ratio may be changed. Consequently, the semiconductor devices using the final CML output signal may not operate normally.

SUMMARY OF THE INVENTION

Exemplary embodiments of the present invention are directed to a circuit which is capable of shifting a power supply voltage level of a CML signal, without changing a swing region.

In accordance with an embodiment of the present invention, a semiconductor device includes a swing level shifting unit configured to use a first power supply voltage as a power supply voltage, receive a CML clock swinging around a first voltage level, and shift a swing reference voltage level of the CML clock to a second voltage level lower than the first voltage level, and a CML clock transfer buffering unit configured to use a second power supply voltage as a power supply voltage and buffer the CML clock, which is transferred from the swing level shifting unit and swings around the second voltage level.

The semiconductor device may further include a CML clock generation buffering unit configured to use the first power supply voltage as a power supply voltage, buffer a source clock to generate the CML clock swinging around the first voltage level, and provide the CML clock to the swing level shifting unit.

In accordance with another embodiment of the present invention, a semiconductor device includes a first swing level shifting unit configured to use a first power supply voltage as a power supply voltage, receive a CML clock swinging around a first voltage level, and shift a swing reference voltage level to a second voltage level lower than the first voltage level, and output a CML clock swinging around the second voltage level, and a second swing level shifting unit configured to use a second power supply voltage as a power supply voltage, receive the CML clock from the first swing level shifting unit, shift a swing reference voltage level to a third voltage level higher than the second voltage level, and output a CML clock swinging around the third voltage level.

The semiconductor device may further include a CML clock generation buffering unit configured to use the first power supply voltage as a power supply voltage, and buffer a source clock to generate the CML clock swinging around the first voltage level lower than the first power supply voltage level by a set voltage level, and provide the generated CML clock to the first swing level shifting unit.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
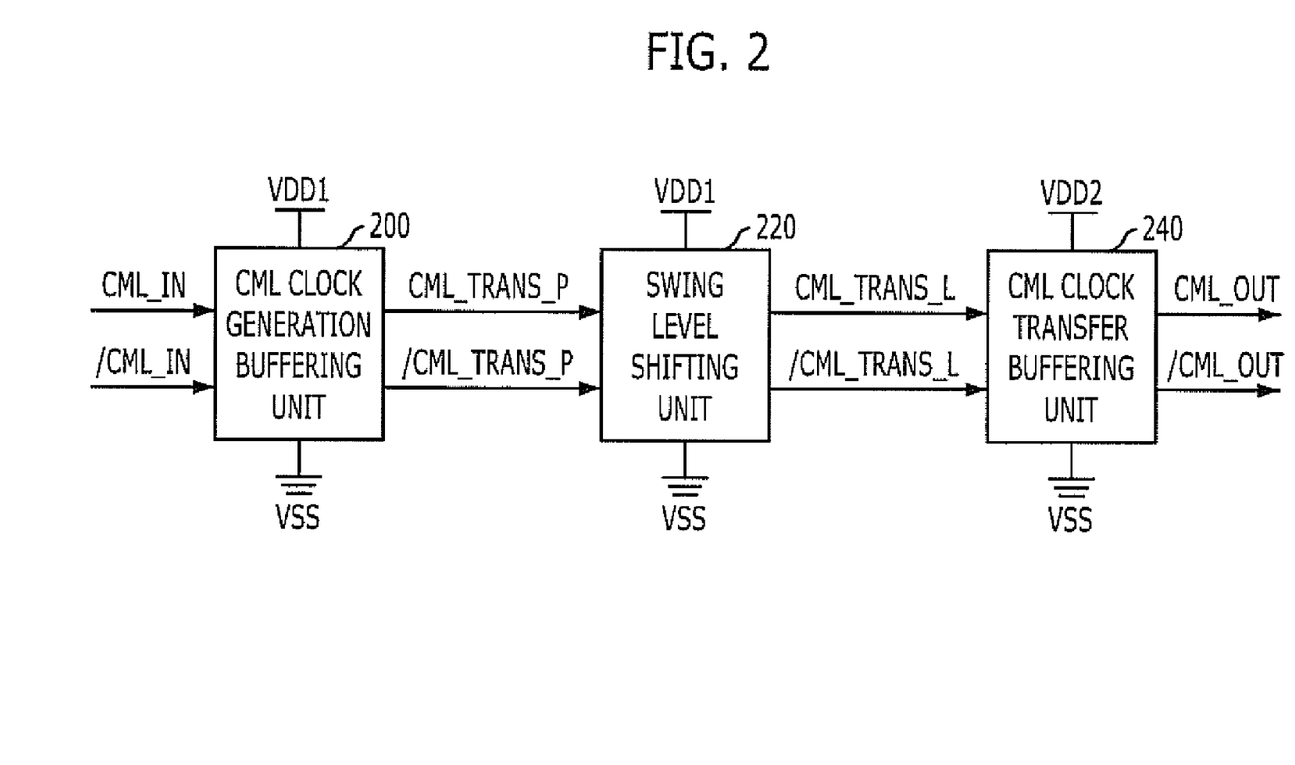
FIG. 2 is a block diagram of a circuit for shifting a power supply voltage level of a CML signal in a semiconductor device in accordance with an embodiment of the present invention.

FIG. 2 is a block diagram of a circuit for shifting a power supply voltage level of a CML signal in a semiconductor device in accordance with an embodiment of the present invention.

Referring to FIG. 2, the circuit for shifting the power supply voltage level of the CML signal in the semiconductor device in accordance with the embodiment of the present invention includes a CML clock generation buffering unit 200, a swing level shifting unit 220, and a CML clock transfer buffering unit 240. The CML clock generation buffering unit 200 uses a first power supply voltage VDD1 as a power supply voltage, and buffers source clocks CML_IN and /CML_IN to generate CML clocks CML_TRANS_P and /CML_TRANS_P swinging around a first voltage level.

The swing level shifting unit 220 uses the first power supply voltage VDD1 as a power supply voltage, receives the CML clocks CML_TRANS_P and /CML_TRANS_P from the CML clock generation buffering unit 200, and shifts a swing reference voltage level to a second voltage level lower than the first voltage level, and outputs CML clocks CML_TRANS_L and /CML_TRANS_L. The CML clock transfer buffering unit 240 uses a second power supply voltage VDD2 as a power supply voltage, buffers the CML clocks CML_TRANS_L and /CML_TRANS_L swinging around the second voltage level, which are transferred from the swing level shifting unit 220, and outputs CML signals CML_OUT and /CML_OUT.

In this case, the level of the first power supply voltage VDD1 may be lower or higher than the level of the second power supply voltage VDD2. However, the voltage level of the first power supply voltage VDD1 is not equal to the voltage level of the second power supply voltage VDD2. Features of the present invention are exhibited when the voltage level of the first power supply voltage VDD1 is higher than the voltage level of the second power supply voltage VDD2.

Furthermore, the source clocks CML_IN and /CML_IN inputted to the CML clock generation buffering unit 200 may be signals swinging in the CML region or the CMOS region. That is, the CML clock generation buffering unit 200 performs the operation of generating the CML clocks CML_TRANS_P and /CML_TRANS_P swinging around the first voltage level, without regard to components of the source clocks CML_IN and /CML_IN.

Figure 3A:
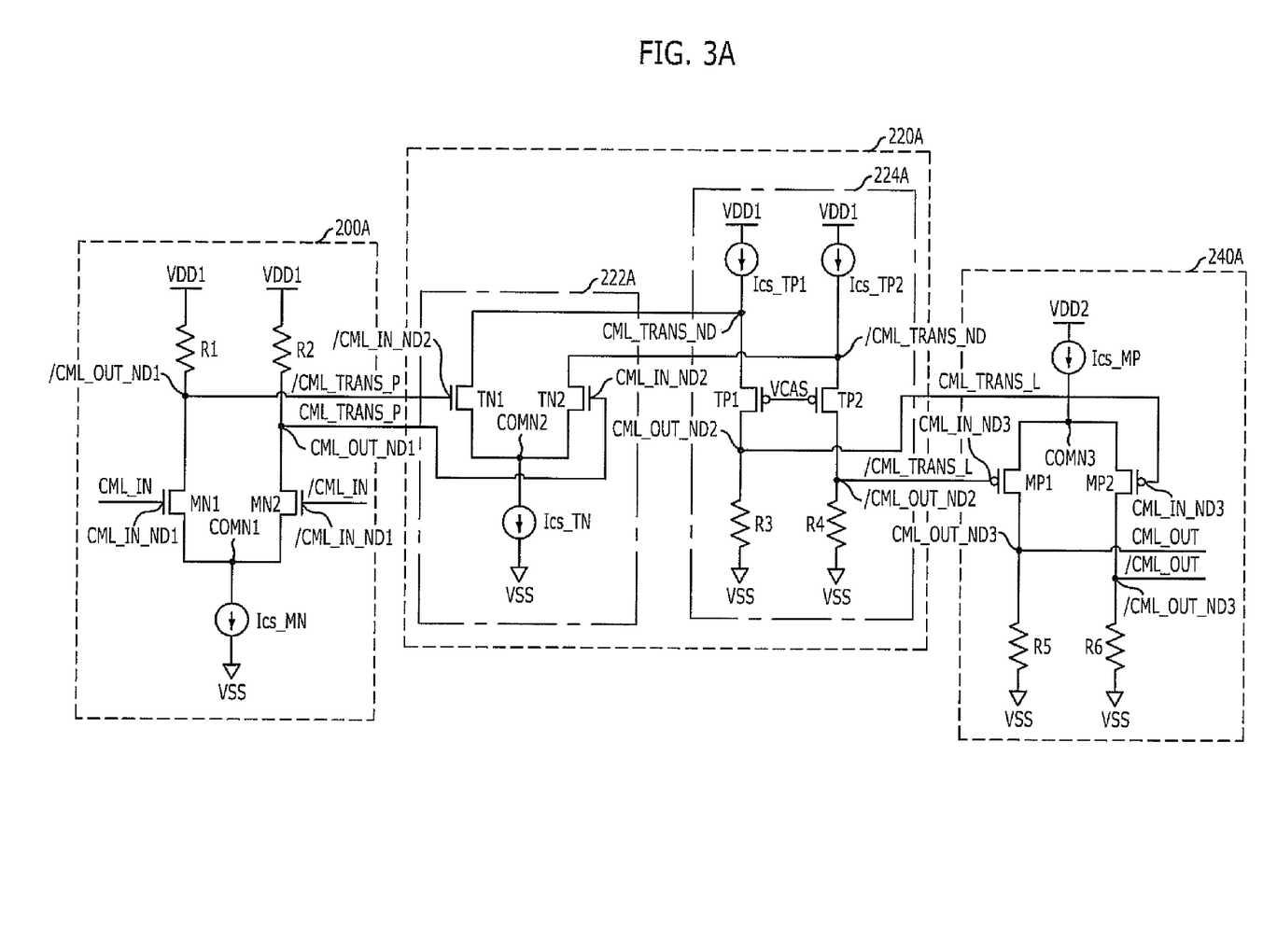
FIG. 3A is a circuit diagram of the circuit for shifting the power supply voltage level of the CML signal in the semiconductor device illustrated in FIG. 2.

FIG. 3A is a circuit diagram of the circuit for shifting the power supply voltage level of the CML signal in the semiconductor device illustrated in FIG. 2.

Referring to FIG. 3A, the CML clock generation buffering unit 200A includes a first buffering NMOS transistor MN1, a first buffering resistor R1, a second buffering NMOS transistor MN2, a second buffering resistor R2, and a buffering sinking current source Ics_MN. The first buffering NMOS transistor MN1 controls the connection between a second output node /CML_OUT_ND1 of buffering CML output nodes CML_OUT_ND1 and /CML_OUT_ND1, which are connected to a drain, and a buffering common node COMN1, which is connected to a source, in response to a first clock CML_IN of source clocks CML_IN and /CML_IN applied to a gate. The first resistor R1 is connected between a first power supply voltage (VDD1) terminal and the second output node /CML_OUT_ND1 and adjusts a swing range of a second CML clock /CML_TRANS_P of CML clocks CML_TRANS_P and /CML_TRANS_P swinging around a first voltage level and outputted to the second output node /CML_OUT_ND1. The second buffering NMOS transistor MN2 controls the connection between the second output node /CML_OUT_ND1 of the buffering CML output nodes CML_OUT_ND1 and /CML_OUT_ND1, which are connected to a drain, and the buffering common node COMN1, which is connected to a source, in response to a second clock /CML_IN of the source clocks CML_IN and /CML_IN applied to a gate. The second resistor R2 is connected between the first power supply voltage (VDD1) terminal and the first output node CML_OUT_ND1 and adjusts a swing range of a first CML clock CML_TRANS_P of the CML clocks CML_TRANS_P and /CML_TRANS_P swinging around the first voltage level and outputted to the first output node CML_OUT_ND1. The buffering sinking current source Ics_MN makes a buffering sinking current flow from the buffering common node COMN1 to the ground voltage (VSS) terminal.

The CML clock transfer buffering unit 240A includes a buffering sourcing current source Ics_MP, a first buffering PMOS transistor MP1, a first resistor R5, a second buffering PMOS transistor MP2, and a second resistor R6. The buffering sourcing current source Ics_MP makes a buffering sourcing current flow from a second power supply voltage (VDD2) terminal to a buffering common node COMN3. The first buffering PMOS transistor MP1 controls the connection between the buffering common node COMN3, which is connected to its source, and a first output node CML_OUT_ND3 of buffering CML output nodes CML_OUT_ND3 and /CML_OUT_ND3, which are connected to its drain, in response to a second clock /CML_TRANS_L of CML clocks CML_TRANS_L and /CML_TRANS_L swinging around a second voltage level and applied to a gate. The first resistor R5 is connected between the first output node CML_OUT_ND3 and the ground voltage (VSS) terminal, and adjusts a swing range of a first clock CML_OUT of CML clocks CML_OUT and /CML_OUT swinging around the second voltage level and outputted through the first output node CML_OUT_ND3. The second buffering PMOS transistor MP2 controls the connection between the buffering common node COMN3, which is connected to its source, and the second output node /CML_OUT_ND3, which is connected to its drain, in response to a first clock CML_TRANS_L of the CML clocks CML_TRANS_L and /CML_TRANS_L swinging around the second voltage level and applied to a gate. The second resistor R6 is connected between the second output node /CML_OUT_ND3 and the ground voltage (VSS) terminal, and adjusts a swing range of a second CML clock /CML_OUT of the CML clocks CML_OUT and /CML_OUT swinging around the second voltage level and outputted through the second output node /CML_OUT_ND3.

The level shifting circuits of FIGS. 2 and 3A are illustrated on the assumption that the inputted/outputted signals are provided in a differential manner. Although it is apparent that most CML signals are inputted/outputted in a differential manner, the circuits may also be operated in a single manner. Thus, the following detailed description will be provided assuming a configuration (not shown) when the CML signals are provided in a single manner, and then, a configuration when the CML signals are provided in a differential manner.

First, the case where the swing level shifting unit 220A is provided in a single manner will be described below. A current source Ics_TP1 makes a current flow from the first power supply voltage (VDD1) terminal to the ground voltage (VSS) terminal or the CML clock output terminal CML_OUT_ND2 in response to the CML clock CML_TRANS_P swinging around the first voltage level. The resistor R3 having a set resistance is connected between the CML clock output terminal CML_OUT_ND2 and the ground voltage (VSS) terminal. In this way, the CML clock CML_TRANS_L swinging around the second voltage level is generated through the CML clock output terminal CML_OUT_ND2.

More specifically, the swing level shifting unit 220A includes a current path changing control unit 222A and a CML clock generation unit 224A. The current path changing control unit 222A controls the connection between a current path changing node CML_TRANS_ND and the ground voltage (VSS) terminal in response to the CML clock CML_TRANS_P swinging around the first level. The current path changing node CML_TRANS_ND is positioned between the first power supply voltage (VDD1) terminal and the CML clock output terminal CML_OUT_ND2. The CML clock generation unit 224A generates the CML clock CML_TRANS_L swinging around the second voltage level through the CML clock output terminal CML_OUT_ND2 according to the operation result of the current path changing control unit 222A.

The current path changing control unit 222A includes a current path selection NMOS transistor TN1 and a current path sinking current source Ics_TN. The current path selection NMOS transistor TN1 controls the connection between a current path changing node CML_TRANS_ND, which is connected to its drain, and a current path common node COMN2, which is connected to its source, in response to the CML clock CML_TRANS_P swinging around the first voltage level and applied to its gate. The current path sinking current source Ics_TN makes a sinking current flow from the current path common node COMN2 to the ground voltage (VSS) terminal.

The CML clock generation unit 224A includes a current path sourcing current source Ics_TP1, a cascade PMOS transistor TP1, and a resistor R3. The current path sourcing current source Ics_TP1 makes a sourcing current flow from the first power supply voltage (VDD1) terminal to the current path changing node CML_TRANS_ND. The cascade PMOS transistor TP1 cascade-connects the current path changing node CML_TRANS_ND, which is connected to its source, and the CML clock output terminal CML_OUT_ND2, which is connected to its drain, in response to a cascade voltage VCAS having a set voltage level and applied to its gate. The resistor R3 is connected between the CML clock output terminal CML_OUT_ND2 and the ground voltage (VSS) terminal and adjusts a swing range of the CML clock CML_TRANS_L swinging around the second voltage level and outputted through the CML clock output terminal CML_OUT_ND2.

In this case, the designer must set the states of the sinking current source Ics_TN and the sourcing current source Ics_TP1 so that the sinking current flowing from the current path common node COMN2 to the ground voltage (VSS) terminal through the sinking current source Ics_TN becomes equal to the sourcing current flowing from the first power supply voltage (VDD1) terminal to the current path changing node CML_TRANS_ND through the current path sourcing current source ICS_TP1.

Next, the case where the swing level shifting unit 220A is provided in a differential manner will be described below. Current sources Ics_TP1 and Ics_TP2 make currents flow from the first power supply voltage (VDD1) terminal to the ground voltage (VSS) terminal or the CML clock output terminals CML_OUT_ND2 and /CML_OUT_ND2 in response to the CML clocks CML_TRANS_P and /CMS_TRANS_P swinging around the first voltage level. The resistors R3 and R4 having set resistance values are connected between the CML clock output terminals CML_OUT_ND2 and /CML_OUT_ND2 and the ground voltage (VSS) terminal. In this way, the CML clocks CML_TRANS_L and /CML_TRANS_L swinging around the second voltage level are generated through the CML clock output terminals CML_OUT_ND2 and /CML_OUT_ND2.

More specifically, the swing level shifting unit 220A includes a current path changing control unit 222A and a CML clock generation unit 224A. The current path changing control unit 222A controls the connection between current path changing nodes CML_TRANS_ND and /CML_TRANS_ND and the ground voltage (VSS) terminal in response to the CML clocks CML_TRANS_P and /CML_TRANS_P swinging around the first voltage level. The current path changing nodes CML_TRANS_ND and /CML_TRANS_ND are positioned between the first power supply voltage (VDD1) terminal and the CML clock output terminals CML_OUT_ND2 and /CML_OUT_ND2, respectively. The CML clock generation unit 224A generates the CML clocks CML_TRANS_L and /CML_TRANS_L swinging around the second voltage level through the CML clock output terminals CML_OUT_ND2 and /CML_OUT_ND2 according to the operation result of the current path changing control unit 222A.

The current path changing control unit 222A includes a first current path selection NMOS transistor TN2, a second current path selection NMOS transistor TN1, and a current path sinking current source Ics_TN. The first current path selection NMOS transistor TN2 controls the connection between a second node /CML_TRANS_ND of the current path changing nodes CML_TRANS_ND and /CML_TRANS_ND, which are connected to its drain, and a current path common node COMN2, which is connected to its source, in response to the first CML clock CML_TRANS_P swinging around the first voltage level and applied to its gate. The second current path selection NMOS transistor TN1 controls the connection between a first node CML_TRANS_ND of the current path changing nodes CML_TRANS_ND and /CML_TRANS_ND, which are connected to its drain, and the current path common node COMN2, which is connected to its source, in response to the second CML clock /CML_TRANS_P swinging around the first voltage level and applied to its gate. The current path sinking current source Ics_TN sinks a set current from the current path common node COMN2 to the ground voltage (VSS) terminal.

In addition, the CML clock generation unit 224A includes a first current path sourcing current source Ics_TP2, a first cascade PMOS transistor TP2, a first resistor R4, a second current path sourcing current source Ics_TP1, a second cascade PMOS transistor TP1, and a second resistor R3. The first current path sourcing current source Ics_TP2 makes a first sourcing current flow from the first power supply voltage (VDD1) terminal to the second node /CML_TRANS_ND. The first cascade PMOS transistor TP2 cascade-connects the second node /CML_TRANS_ND of the current path changing nodes CML_TRANS_ND and /CML_TRANS_ND, which are connected to its source, and the second output terminal /CML_OUT_ND2 of the CML clock output terminals CML_OUT_ND2 and /CML_OUT_ND2, which are connected to its drain, in response to a cascade voltage VCAS having a set voltage level and applied to its gate. The first resistor R4 is connected between the second output terminal /CML_OUT_ND2 and the ground voltage (VSS) terminal and adjusts a swing range of the second CML clock /CML_TRANS_L swinging around the second voltage level and outputted through the second output terminal /CML_OUT_ND2. The second current path sourcing current source ICS_TP1 makes a second sourcing current flow from the first power supply voltage (VDD1) terminal to the first node CML_TRANS_ND. The second cascade PMOS transistor TP1 cascade-connects the first node CML_TRANS_ND of the current path changing nodes CML_TRANS_ND and /CML_TRANS_ND, which are connected to its source, and the first output terminal CML_OUT_ND2 of the CML clock output terminals CML_OUT_ND2 and /CML_OUT_ND2, which are connected to its drain, in response to the cascade voltage VCAS having a set voltage level and applied to its gate. The second resistor R3 is connected between the first output terminal CML_OUT_ND2 and the ground voltage (VSS) terminal and adjusts a swing range of the first CML clock CML_TRANS_L swinging around the second voltage level and outputted through the first output terminal CML_OUT_ND2.

In this case, the designer must set the states of the sinking current source Ics_TN and the first and second sourcing current sources Ics_TP1 and Ics_TP2, so that the sinking current flowing from the current path common node COMN2 to the ground voltage (VSS) terminal through the sinking current source Ics_TN becomes equal to the sourcing currents flowing from the first power supply voltage (VDD1) terminal to the first and second current path changing nodes CML_TRANS_ND and /CML_TRANS_ND through the first current path sourcing current source Ics_TP1 and Ics_TP2.

The operation of the circuit for shifting the power supply voltage level of the CML signal in the semiconductor device in accordance with the embodiment of the present invention will be described below with reference to FIG. 3C.

Figure 3B:
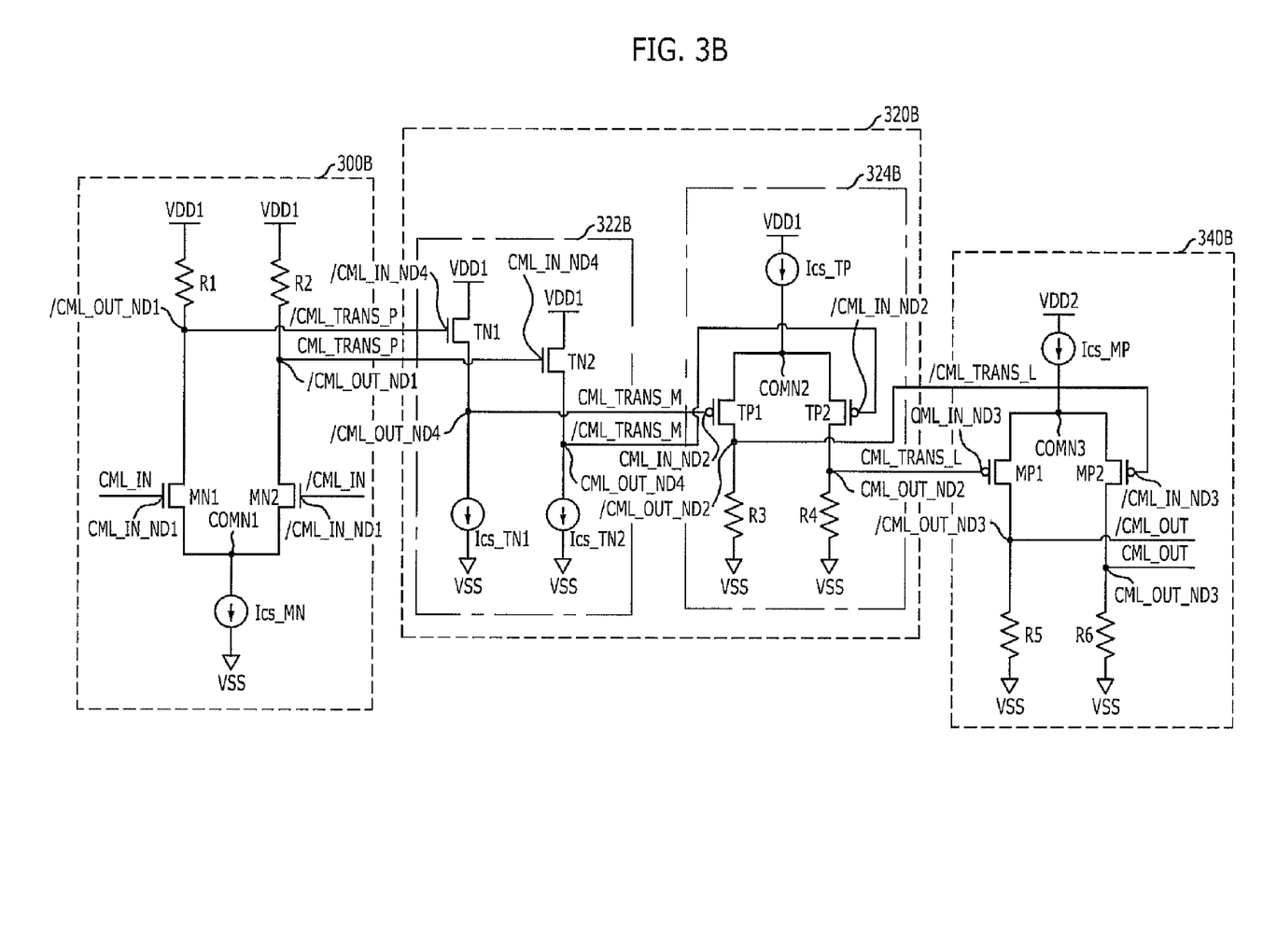
FIG. 3B is another circuit diagram of the circuit for shifting the power supply voltage level of the CML signal in the semiconductor device illustrated in FIG. 2.
Figure 3C:
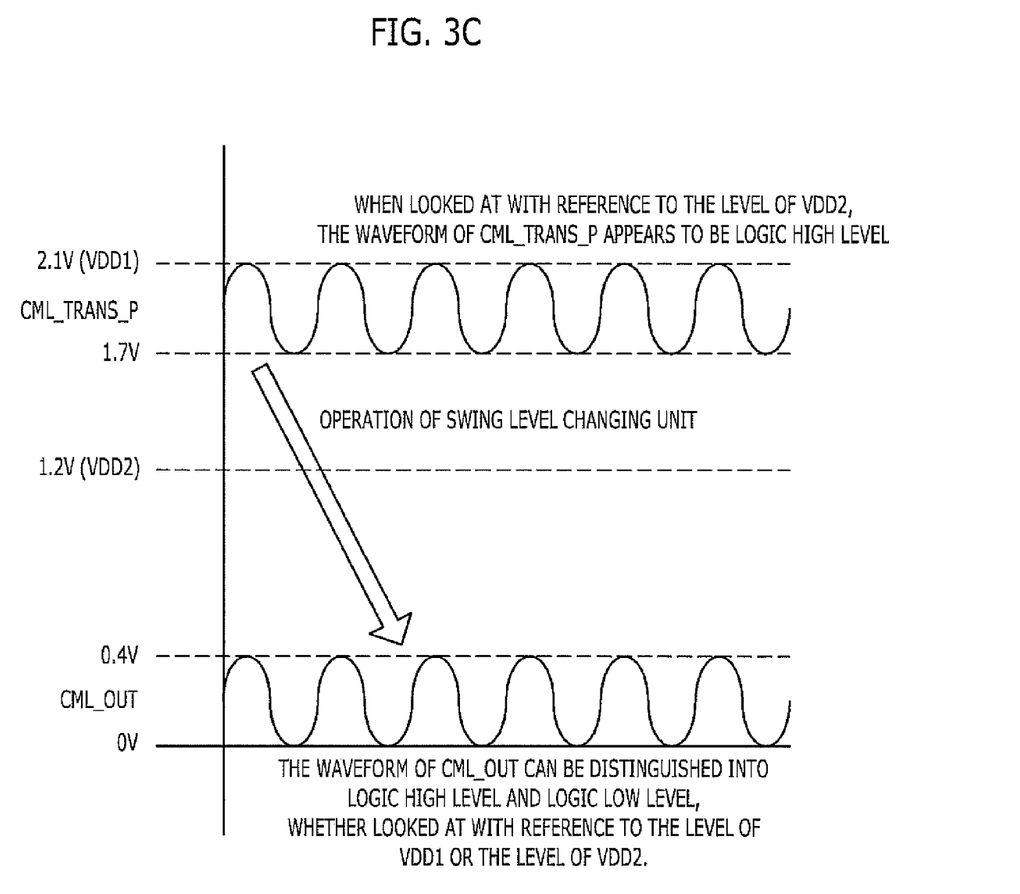
FIG. 3C is a waveform diagram explaining the operations of the circuits illustrated in FIGS. 2, 3A and 3B.

Referring to FIG. 3C, when the voltage level of the first power supply voltage VDD1 is 2.1 V, the CML signals CML_TRANS_P and /CML_TRANS_P outputted from the CML clock generation buffering unit 200A have a swing width of 0.4 V in a swing range from 2.1 V to 1.7 V.

In this case, when assuming that the first CML signal CML_TRANS_P outputted from the CML clock generation buffering unit 200A is 2.1 V and the second CML signal /CML_TRANS_P outputted from the CML clock generation buffering unit 200A is 1.7 V, the first current path selection NMOS transistor TN2 provided in the current path changing control unit 222A is turned on, and the second current path selection NMOS transistor TN1 is turned off. Therefore, the sourcing current provided from the first power supply voltage (VDD1) terminal to the second current path changing node /CML_TRANS_ND through the first current path sourcing current source Ics_TP2 flows to the ground voltage (VSS) terminal through the sinking current source Ics_TN and the current path common node COMN2, and the sourcing current provided from the first power supply voltage (VDD1) terminal to the first current path changing node CML_TRANS_ND through the second current path sourcing current source Ics_TP1 is provided to the first CML clock output terminal CML_OUT_ND2. Hence, according to the voltage division law and the resistance of the second resistor R3, the operation of adjusting the swing width of the first clock CML_TRANS_L is performed. Therefore, the first clock CML_TRANS_L outputted from the first CML clock output terminal CML_OUT_ND2 has a specific voltage level lower than the first power supply voltage VDD1. Ideally, the specific voltage level of the first clock CML_TRANS_L is 0.4 V. On the contrary, the second clock /CML_TRANS_L outputted from the second CML clock output terminal /CML_OUT_ND2, which supplies no current, has the same level as the ground voltage. Thus, ideally the voltage of the second clock /CML_TRANS_L is 0 V.

Likewise, when assuming that the first CML signal CML_TRANS_P outputted from the CML clock generation buffering unit 200A is 1.7 V and the second CML signal /CML_TRANS_P outputted from the CML clock generation buffering unit 200A is 2.1 V, the first current path selection NMOS transistor TN2 provided in the current path changing control unit 222A is turned off, and the second current path selection NMOS transistor TN1 is turned on. Therefore, the sourcing current provided from the first power supply voltage (VDD1) terminal to the first current path changing node CML_TRANS_ND through the second current path sourcing current source Ics_TP1 flows to the ground voltage (VSS) terminal through the sinking current source Ics_TN and the current path common node COMN2, and the sourcing current provided from the first power supply voltage (VDD1) terminal to the second current path changing node /CML_TRANS_ND through the first current path sourcing current source Ics_TP2 is provided to the second CML clock output terminal /CML_OUT_ND2. Hence, according to the voltage division law and the resistance of the first resistor R4, the operation of adjusting the swing width of the second clock /CML_TRANS_L is performed. Therefore, the second clock /CML_TRANS_L outputted from the second CML clock output terminal /CML_OUT_ND2 has a specific voltage level lower than the first power supply voltage VDD1. Ideally, the specific voltage level of the second clock /CML_TRANS_L is 0.4 V. On the contrary, the first clock CML_TRANS_L outputted from the first CML clock output terminal CML_OUT_ND2, which supplies no current, has the same level as the ground voltage. Thus, ideally the voltage of the first clock CML_TRANS_L is 0 V. In this way, the clocks outputted from the CML clock output terminals CML_OUT_ND2 and /CML_OUT_ND2 have a swing width of 0.4 V in a swing range from 0.4 V to 0 V.

If the swing range leans toward the ground voltage (VSS) level, and not the first power supply voltage (VDD1) level, due to the swing level shifting unit 220A, the PMOS transistors MP1 and MP2 provided in the CML clock transfer buffering unit 240 may be turned on/off, whether or not the second power supply voltage (VDD2) level is higher than the first power supply voltage (VDD1) level. Thus, the CML clock transfer buffering unit 240A generates the CML signals CML_OUT and /CML_OUT normally, thereby performing the power supply voltage level shifting operation successfully.

FIG. 3B is another circuit diagram of the circuit for shifting the power supply voltage level of the CML signal in the semiconductor device illustrated in FIG. 2.

Referring to FIG. 3B, the power supply voltage level shifting circuit of FIG. 3B is identical to the power supply voltage level shifting circuit of FIG. 3A, except for a swing level shifting unit 320B. Therefore, only the swing level shifting unit 320B will be described below.

First, the case where the swing level shifting unit 320B is provided in a single manner will be described. The swing level shifting unit 320B includes a voltage level drop unit 322B and a CML clock generation unit 324B. The voltage level drop unit 322B drops the voltage levels of the CML clocks CML_TRANS_P and /CML_TRANS_P swinging around the first voltage level by a set voltage level, and outputs CML voltage drop clocks CML_TRANS_M and /CML_TRANS_M. The CML clock generation unit 324B generates CML clocks CML_TRANS_L and /CML_TRANS_L swinging around the second voltage level through the CML clock output terminals CML_OUT_ND2 and /CML_OUT_ND2 by performing a control operation to supply the current provided through the first power supply voltage (VDD1) terminal to the CML clock output terminals CML_OUT_ND2 and /CML_OUT_ND2 in response to the CML voltage drop clocks CML_TRANS_M and /CML_TRANS_M. Resistors R3 and R4 having set resistances are connected between the CML clock output terminals CML_OUT_ND2 and /CML_OUT_ND2 and the ground voltage (VSS) terminal.

The voltage level drop unit 322B includes source follow NMOS transistors TN1 and TN2, and voltage drop sinking current sources Ics_TN1 and Ics_TN2. The source follow NMOS transistors TN1 and TN2 output the CML voltage drop clocks CML_TRANS_M and /CML_TRANS_M through voltage drop clock output terminals CML_OUT_ND4 and /CML_OUT_ND4 by source-follow-connecting the first power supply voltage (VDD1) terminal, which is connected to their drains, and the voltage drop clock output terminals CML_OUT_ND4 and /CML_OUT_ND4, which are connected to their sources, in response to the CML clocks CML_TRANS_P and /CML_TRANS_P swinging around the first voltage level and applied to their gates. The voltage drop sinking current sources Ics_TN1 and Ics_TN2 make a sinking current flow from the voltage drop output terminals CML_OUT_ND4 and /CML_OUT_ND4 to the ground voltage (VSS) terminal. The voltage level drop unit 322B may drop the swing reference level of the CML clocks CML_TRANS_P and /CML_TRANS_P swinging around the first voltage level through the source following operation, and the dropped voltage level may be determined by size variation of the source follow NMOS transistors TN1 and TN2.

The CML clock generation unit 324B includes a sourcing current source Ics_TP, clock generation PMOS transistors TP1 and TP2, and resistors R3 and R4. The sourcing current source Ics_TP makes a sourcing current flow from the first power supply voltage (VDD1) terminal to a clock generation common node COMN2. The clock generation PMOS transistors TP1 and TP2 control the connection between the clock generation common node COMN2, which is connected to their sources, and the CML clock output terminals CML_OUT_ND2 and /CML_OUT_ND2, which are connected to their drains, in response to the CML voltage drop cocks CML_TRANS_M and /CML_TRANS_Mapplied to their gates. The resistors R3 and R4 are connected between the CML clock output terminals CML_OUT_ND2 and /CML_OUT_ND2 and the ground voltage (VSS) terminal, and adjust a swing range of the CML clocks CML_TRANS_L and /CML_TRANS_L swinging around the second voltage level and outputted through the CML clock output terminals CML_OUT_ND2 and /CML_OUT_ND2.

In this case, the states of the voltage drop sinking current source Ics_TN1 and Ics_TN2 and the buffering sourcing current source Ics_TP must be set so that the sinking current flowing from the voltage drop clock output terminals CML_OUT_ND4 and /CML_OUT_ND4 to the ground voltage (VSS) terminal through the voltage drop sinking current sources Ics_TN1 and Ics_TN2 becomes equal to the sourcing current flowing from the first power supply voltage (VDD1) terminal to the clock generation common node COMN2 through the buffering sourcing current source Ics_TP.

Next, the case where the swing level shifting unit 320B is provided in a differential manner will be described. The swing level shifting unit 320B includes a voltage level drop unit 322B and a CML clock generation unit 324B. The voltage level drop unit 322B drops the voltage levels of the CML clocks CML_TRANS_P and /CML_TRANS_P swinging around the first voltage level by a set voltage level, and outputs CML voltage drop clocks CML_TRANS_M and /CML_TRANS_M. The CML clock generation unit 324B generates CML clocks CML_TRANS_L and /CML_TRANS_L swinging around the second voltage level through the CML clock output terminals CML_OUT_ND2 and /CML_OUT_ND2 by performing a control operation to supply the current provided through the first power supply voltage (VDD1) terminal to the CML clock output terminals CML_OUT_ND2 and /CML_OUT_ND2 in response to the CML voltage drop clocks CML_TRANS_M and /CML_TRANS_M. Resistors R3 and R4 having set resistances are connected between the CML clock output terminals CML_OUT_ND2 and /CML_OUT_ND2 and the ground voltage (VSS) terminal.

The voltage level drop unit 322B includes a first source follow NMOS transistor TN2, a second source follow NMOS transistor TN1, a first voltage drop sinking current source Ics_TN2, and a second voltage drop sinking current source Ics_TN1. The first source follow NMOS transistor TN2 outputs the second clock /CML_TRANS_M through the second output terminal /CML_OUT_ND4 by source-follow-connecting the first power supply voltage (VDD1) terminal, which is connected to its drain, and the second output terminal /CMS_OUT_ND4 of the voltage drop clock output terminals CML_OUT_ND4 and /CML_OUT_ND4, which are connected to its source, in response to the first CML clock CML_TRANS_P swinging around the first voltage level and applied to its gate. The second source follow NMOS transistor TN1 outputs the first clock CML_TRANS_M through the first output terminal CML_OUT_ND4 by source-follow-connecting the first power supply voltage (VDD1) terminal, which is connected to its drain, and the first output terminal CMS_OUT_ND4 of the voltage drop clock output terminals CML_OUT_ND4 and /CML_OUT_ND4, which are connected to its source, in response to the second CML clock /CML_TRANS_P swinging around the first voltage level and applied to its gate. The first voltage drop sinking current source Ics_TN2 makes a first sinking current flow from the second output terminal /CML_OUT_ND4 to the ground voltage (VSS) terminal. The second voltage drop sinking current source Ics_TN1 makes a second sinking current flow from the first output terminal CML_OUT_ND4 to the ground voltage (VSS) terminal. The voltage level drop unit 322B may drop the swing reference level of the CML clocks CML_TRANS_P and /CML_TRANS_P swinging around the first voltage level through the source following operation, and the dropped voltage level may be determined by size variation of the source follow NMOS transistors TN1 and TN2.

The CML clock generation unit 324B includes a sourcing current source Ics_TP, a first clock generation PMOS transistor TP2, a second clock generation PMOS transistor TP1, a first resistor R4, and a second resistor R3. The sourcing current source Ics_TP makes a sourcing current flow from the first power supply voltage (VDD1) terminal to a clock generation common node COMN2. The first clock generation PMOS transistor TP2 controls the connection between the clock generation common node COMN2, which is connected to its source, and the first output terminal CML_OUT_ND2, which is connected to its drain, in response to the second clock /CML_TRANS_M applied to its gate. The second clock generation PMOS transistor TP1 controls the connection between the clock generation common node COMN2, which is connected to its source, and the second output terminal /CML_OUT_ND2, which is connected to its drain, in response to the first clock CML_TRANS_M applied to its gate. The first resistor R4 is connected between the first output terminal CML_OUT_ND2 and the ground voltage (VSS) terminal, and adjusts a swing range of the first clock CML_TRANS_L swinging around the second voltage level and outputted through the first output terminal CML_OUT_ND2. The second resistor R3 is connected between the second output terminal /CML_OUT_ND2 and the ground voltage (VSS) terminal, and adjusts a swing range of the second clock /CML_TRANS_L swinging around the second voltage level and outputted through the second output terminal /CML_OUT_ND2.

In this case, the states of the first and second voltage drop sinking current source Ics_TN1 and Ics_TN2 and the buffering sourcing current source Ics_TP must be set so that the first and second sinking currents flowing from the first and second voltage drop clock output terminals CML_OUT_ND4 and /CML_OUT_ND4 to the ground voltage (VSS) terminal through the voltage drop sinking current sources Ics_TN1 and Ics_TN2 become equal to the sourcing current flowing from the first power supply voltage (VDD1) terminal to the clock generation common node COMN2 through the buffering sourcing current source Ics_TP.

The configuration and operation of the power supply voltage level shifting circuit of FIG. 3B are similar to those of the power supply voltage level shifting circuit of FIG. 3A. However, the power supply voltage level shifting circuit of FIG. 3A shifts the reference voltage level of the CML signal by using a folded-cascade amplifier which properly adjusts a current direction, whereas the power supply voltage level shifting circuit of FIG. 3B shifts the reference voltage level of the CML signal by using a source follower scheme which forcibly drops the voltage level of the input signal.

The CML signals CML_OUT and /CML_OUT outputted by the operations of the power supply voltage level shifting circuits of FIGS. 3A and 3B are expected to have the swing widths set in a state that the swing ranges lean toward the ground voltage (VSS) level.

Generally, the CML signal refers to a signal having a swing width set in a state where its swing range leans toward the power supply voltage (VDD) level. That is, when the typical semiconductor device uses a CML signal, it does not use a signal having a swing width set in a state where its swing range leans toward the ground voltage (VSS) level, but rather, uses a signal having a swing width set in a state where its swing range leans toward the power supply voltage (VDD) level.

Therefore, the circuits for shifting the power supply voltage level of the CML signal in the semiconductor device illustrated in FIGS. 3A and 3B require the process of shifting the swing ranges of the CML signals CML_OUT and /CML_OUT from the ground voltage (VSS) level to the power supply voltage (VDD) level.

However, the circuit for shifting the CML signals CML_OUT and /CML_OUT from the power supply voltage (VDD) level to the ground voltage (VSS) level is essentially illustrated in FIG. 2. That is, the above-described operation may be performed by reversing the NMOS transistors TN1 and TN2 and the PMOS transistors TP1 and TP2 in the configuration of the swing level shifting unit 220A illustrated in FIG. 3A.

Figure 4:
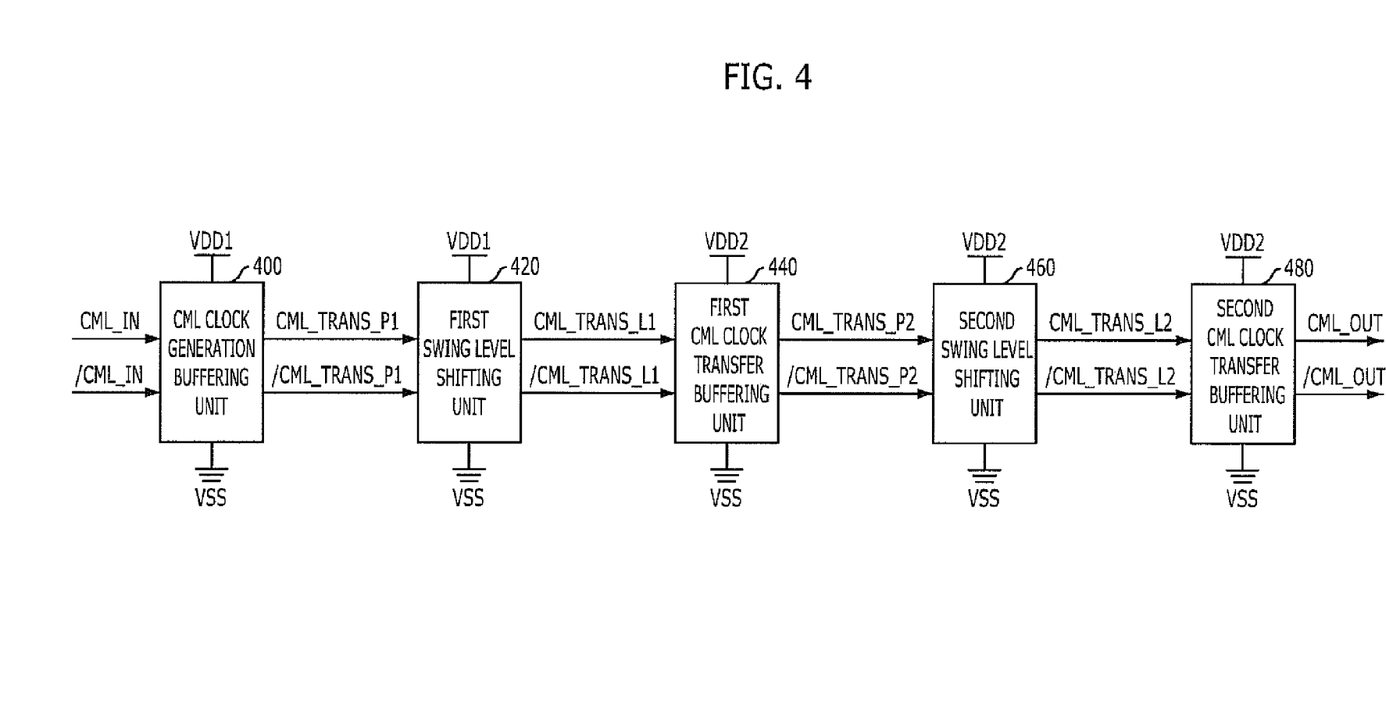
FIG. 4 is a block diagram of a circuit for shifting the power supply voltage level of the CML signal in the semiconductor device in accordance with an embodiment of the present invention.

FIG. 4 is a block diagram of a circuit for shifting the power supply voltage level of the CML signal in the semiconductor device in accordance with an embodiment of the present invention. More specifically, the circuit for shifting the power supply voltage of the CML signal includes a CML clock generation buffering unit 400, a first swing level shifting unit 420, and a second swing level shifting unit 460. The CML clock generation buffering unit 400 uses the first power supply voltage as a power supply voltage, and buffers source clocks CML_IN and /CML_IN to generate CML clocks CML_TRANS_P1 and /CML_TRANS_P1 swinging around the first voltage level. The first swing level shifting unit 420 uses the first power supply voltage VDD1 as a power supply voltage, receives the CML clocks CML_TRANS_P1 and /CML_TRANS_P1 from the CML clock generation buffering unit 400, and shifts a swing reference level to a second voltage level lower than the first voltage level, and outputs CML clocks CML_TRANS_L1 and /CML_TRANS_L1. Although not shown in FIG. 4, the second swing level shifting unit 460 may use a second power supply voltage VDD2 as a power supply voltage, receive the CML clocks CML_TRANS_L1 and /CML_TRANS_L1 from the first swing level shifting unit 420, and shift a swing reference level to a third voltage level higher than the second voltage level, and output CML clocks CML_TRANS_L2 and /CML_TRANS_L2.

However, as shown in FIG. 4, a first CML clock transfer buffering unit 440 having a similar configuration to the CML clock transfer buffering unit 240 of FIG. 3A may be further provided between the first swing level shifting unit 420 and the second swing level shifting unit 460. Specifically, the first CML clock transfer buffering unit 440 uses the second power supply voltage VDD2 as a power supply voltage, and buffers the CML clocks CML_TRANS_L1 and /CML_TRANS_L1 transferred from the first swing level shifting unit 420 to generate CML clocks CML_TRANS_P2 and /CML_TRANS_P2 to the second swing level shifting unit 460.

A second CML clock transfer buffering unit 480 having a similar configuration to the CML clock generation buffering unit 200A of FIG. 3A may be further provided at the output stage of the second swing level shifting unit 460. Specifically, the second CML clock transfer buffering unit 480 uses the second power supply voltage VDD2 as a power supply voltage, and buffers the CML clocks CML_TRANS_L2 and /CML_TRANS_L2 transferred from the second swing level shifting unit 460 and swinging around the third voltage level to generate CML clocks CML_OUT and /CML_OUT to internal circuits (not shown) which perform their set operations.

In the configuration of FIG. 4, the first voltage level and the third voltage level may be equal to each other, or the first voltage level may be higher than the third voltage level. Furthermore, the first voltage level may be lower than the third voltage level. That is, since the first voltage level and the third voltage level are not dependent on each other, the first power supply voltage VDD1 may be higher or lower than the second power supply voltage VDD2.

Figure 5:
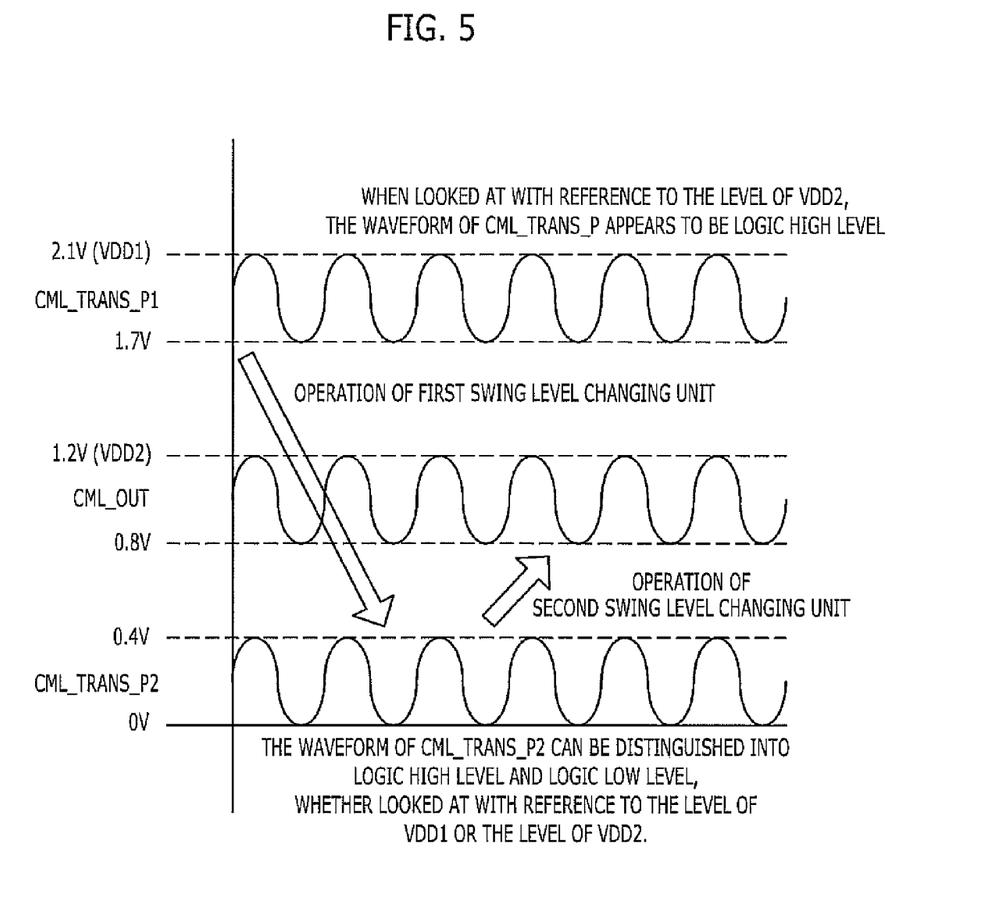
FIG. 5 is a waveform diagram explaining the operation of the circuit illustrated in FIG. 5.

The operation of the circuit illustrated in FIG. 4 will be described below with reference to FIG. 5.

First, when the first power supply voltage (VDD1) level is 2.1 V, the CML signals CML_TRANS_P1 and /CML_TRANS_P1 outputted from the CML clock generation buffering unit 400 have a swing width of 0.4 V in a swing range of 2.1 V to 1.7 V.

If the operation of shifting the swing reference level is performed by providing the CML signals CML_TRANS_P1 and /CML_TRANS_P1 having the swing width of 0.4 V and the swing range of 2.1 V to 1.7 V to the first swing level shifting unit 420, which uses the first power supply voltage VDD1 as a power supply voltage like the CML clock generation buffering unit 400 and performs the same operation as the swing level shifting unit 220A of FIG. 3A, the first swing level shifting unit 420 outputs the CML signals CML_TRANS_P2 and /CML_TRANS_P2 having the swing width of 0.4 V and the swing range of 0.4 V to 0 V.

If the operation of shifting the swing reference level is performed by providing the CML signals CML_TRANS_P2 and /CML_TRANS_P2 having the swing width of 0.4 V and the swing range of 0.4 V to 0 V to the second swing level shifting unit 460, which uses the different power supply voltage from the first swing level shifting unit 420 (in this case, the second power supply voltage VDD2), and performs the opposite operation to the swing level shifting unit 220A of FIG. 3A, the second swing level shifting unit 460 outputs the CML signals CML_OUT and /CML_OUT having the swing width of 0.4 V and the swing range of 1.2 V to 0.8 V.

As described above, if the first swing level shifting unit 420 and the second swing level shifting unit 460 performing the opposite operations to each other use the power supply voltage level, the power supply voltage level shifting operation may be performed stably, while the CML signals swing in the CML region, without changing the swing regions of the CML signals CML_IN and /CML_IN. Furthermore, the CML input signals CML_IN and /CML_IN and the CML output signals CML_OUT and /CML_OUT may swing in such a state that they lean toward the power supply voltage VDD1 or VDD2.

As described above, the power supply voltage level of the CML signals may be shifted, without changing the swing region, by adding the operation of properly shifting the swing levels of the CML signals in the course of the operation of shifting the power supply voltage level of the CML signals.

Consequently, jitters may be minimized during the operation of shifting the power supply voltage level of the CML signal, and the change of the duty ratio may be minimized.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
 a swing level shifting unit configured to use a first power supply voltage as a power supply voltage, receive a first CML clock swinging around a swing reference voltage level equal to a first voltage level, shift the swing reference voltage level to a second voltage level lower than the first voltage level, and output a second CML clock swinging around the second voltage level; and
 a CML clock transfer buffering unit configured to receive the second CML clock, use a second power supply voltage as a power supply voltage, buffer the second CML clock, and output the buffered second CML clock as a CML signal,
 wherein the first CML clock and the second CML clock have the same swing width.

2. The semiconductor device of claim 1, further comprising a CML clock generation buffering unit configured to use the first power supply voltage as a power supply voltage, buffer a source clock to generate the first CML clock, and provide the first CML clock to the swing level shifting unit.

3. The semiconductor device of claim 2, wherein the swing level shifting unit is configured to make a current, which is provided through a first power supply voltage terminal, flow through a CML clock output terminal or a ground voltage terminal in response to the first CML clock, and generate the second CML clock, which is outputted through the CML clock output terminal, which is coupled to a resistor having a set resistance and being connected between the CML clock output terminal and the ground voltage terminal.

4. The semiconductor device of claim 3, wherein the swing level shifting unit comprises:
 a current path changing control unit configured to control the connection between a current path changing node and the ground voltage terminal in response to the first CML clock, the current path changing node being positioned between the first power supply voltage terminal and the CIVIL clock output terminal; and
 a CML clock generation unit configured to generate the second CML clock, which is outputted through the CML clock output terminal according to an operation result of the current path changing control unit.

5. The semiconductor device of claim 4, wherein the current path changing control unit comprises:
 a current path selection MOS transistor configured to control the connection between the current path changing node and a current path common node in response to the first CML clock; and
 a current path sinking current source configured to make a sinking current flow from the current path common node to the ground voltage terminal.

6. The semiconductor device of claim 5, wherein the CML clock generation unit comprises:
 a current path sourcing current source configured to make a sourcing current flow from the first power supply voltage terminal to the current path changing node;

a MOS transistor configured to connect the current path changing node and the CML clock output terminal in response to a cascade voltage having a set voltage level; and a resistor connected between the CML clock output terminal and the ground voltage terminal and configured to adjust a swing range of the second CML clock, which is outputted through the CML clock output terminal.

7. The semiconductor device of claim 6, wherein the sinking current and the sourcing current are equal to each other in magnitude.

8. The semiconductor device of claim 2, wherein the swing level shifting unit comprises:
   a voltage level drop unit configured to drop the swing reference voltage level of the first CML clock by a set voltage level, and output a CML voltage drop clock; and
   a CML clock generation unit configured to generate the second CML clock, which is outputted through the CML clock output terminal, by adjusting a current provided through a first power supply voltage terminal to the CML clock output terminal in response to the CML voltage drop clock.

9. The semiconductor device of claim 8, wherein the voltage level drop unit comprises:
   a source follow MOS transistor configured to output the CML voltage drop clock through a voltage drop clock output terminal by source-follow-connecting the first power supply voltage terminal and the voltage drop clock output terminal in response to the first CML clock; and
   a voltage drop sinking current source configured to make a sinking current flow from the voltage drop output terminal to the ground voltage terminal.

10. The semiconductor device of claim 9, wherein the CML clock generation unit comprises:
    a clock generation sourcing current source configured to make a sourcing current flow from the first power supply voltage terminal to a clock generation common node;
    a clock generation MOS transistor configured to control the connection between the clock generation common node and the CML clock output terminal in response to the CML voltage drop clock; and
    a resistor connected between the CML clock output terminal and the ground voltage terminal and configured to adjust a swing range of the second CML clock, which is outputted through the CML clock output terminal.

11. The semiconductor device of claim 10, wherein the sinking current and the sourcing current are equal to each other in magnitude.

12. The semiconductor device of claim 2, wherein the CML clock generation buffering unit comprises:
    a first buffering MOS transistor configured to control the connection between a second buffering CML output node and a buffering common node in response to a first source clock;
    a first buffering resistor connected between a first power supply voltage terminal and the second buffering CML output node;
    a second buffering MOS transistor configured to control the connection between a first buffering CML output node and the buffering common node in response to a second source clock;
    a second buffering resistor connected between the first power supply voltage terminal and the first buffering CML output node; and
    a buffering sinking current source configured to make a buffering sinking current flow from the buffering common node to the ground voltage terminal.

13. The semiconductor device of claim 2, wherein the CML clock transfer buffering unit comprises:
    a buffering sourcing current source configured to make a buffering sourcing current flow from a second power supply voltage terminal to a buffering common node;
    a first buffering MOS transistor configured to control the connection between the buffering common node and a first buffering CML output node in response to the second CML clock;
    a first resistor connected between the first buffering CML output node and the ground voltage terminal;
    a second buffering MOS transistor configured to control the connection between the buffering common node and the second buffering CML output node in response to the second CML clock; and
    a second resistor connected between the second buffering CML output node and the ground voltage terminal.

14. A semiconductor device, comprising:
    a first swing level shifting unit configured to use a first power supply voltage as a power supply voltage, receive a CML clock swinging around a first voltage level, and shift a swing reference voltage level to a second voltage level lower than the first voltage level, and output a CML clock swinging around the second voltage level; and
    a second swing level shifting unit configured to use a second power supply voltage as a power supply voltage, receive the CML clock from the first swing level shifting unit, shift a swing reference voltage level to a third voltage level higher than the second voltage level, and output a CML clock swinging around the third voltage level.

15. The semiconductor device of claim 14, further comprising a first CML clock generation buffering unit configured to use the first power supply voltage as a power supply voltage, and buffer a source clock to generate the CIVIL clock swinging around the first voltage level lower than the first power supply voltage level by a set voltage level, and provide the generated CML clock to the first swing level shifting unit.

16. The semiconductor device of claim 15, further comprising a first CML clock transfer buffering unit configured to use the second power supply voltage as a power supply voltage, buffer the CML clock swinging around the second voltage level, which is transferred from the first swing level shifting unit, and transfer the CML clock to the second swing level shifting unit, after the CML clock is buffered.

17. The semiconductor device of claim 16, further comprising a second CML clock transfer buffering unit configured to use the second power supply voltage as a power supply voltage, buffer the CML clock swinging around the third voltage level, which is transferred from the second swing level shifting unit, and transfer the CML clock to an internal circuit which performs a preset operation, after the CIVIL clock is buffered.

* * * * *